United States Patent
Xing et al.

(10) Patent No.: US 9,410,019 B2
(45) Date of Patent: Aug. 9, 2016

(54) POLYCARBOSILANE AND CURABLE COMPOSITIONS FOR LED ENCAPSULANTS COMPRISING SAME

(71) Applicant: Henkel AG & Co. KGaA, Duesseldorf (DE)

(72) Inventors: Thomas Xing, Shanghai (CN); Liwei Zhang, Shanghai (CN); Zhiming Pasing Li, Shanghai (CN); Yong Zhang, Shanghai (CN); Juan Du, Shanghai (CN)

(73) Assignee: Henkel AG & Co. KGaA, Duesseldorf (DE)

( * ) Notice: Subject to any disclaimer, the term of this patent is extended or adjusted under 35 U.S.C. 154(b) by 0 days.

(21) Appl. No.: 14/609,863

(22) Filed: Jan. 30, 2015

(65) Prior Publication Data

US 2015/0137172 A1    May 21, 2015

Related U.S. Application Data

(63) Continuation of application No. PCT/CN2012/079565, filed on Aug. 2, 2012.

(51) Int. Cl.
| | | |
|---|---|---|
| *C08G 77/60* | (2006.01) | |
| *C09D 183/16* | (2006.01) | |
| *C08L 83/16* | (2006.01) | |
| *H01L 33/56* | (2010.01) | |

(52) U.S. Cl.
CPC ............... *C08G 77/60* (2013.01); *C08L 83/16* (2013.01); *C09D 183/16* (2013.01); *H01L 33/56* (2013.01); *C08G 2190/00* (2013.01)

(58) Field of Classification Search
CPC .......................... C08G 77/60; C08G 2190/00
See application file for complete search history.

(56) References Cited

U.S. PATENT DOCUMENTS

| 5,691,433 | A | | 11/1997 | Kotani et al. |
|---|---|---|---|---|
| 5,907,899 | A | * | 6/1999 | Dahn ............... H01M 4/587 252/182.1 |
| 5,969,073 | A | | 10/1999 | Seyferth et al. |
| 2007/0249790 | A1 | | 10/2007 | Kashiwagi et al. |
| 2008/0160322 | A1 | | 7/2008 | Mochizuki et al. |

FOREIGN PATENT DOCUMENTS

| EP | 0661332 | A2 | 7/1995 |
|---|---|---|---|
| EP | 0927736 | A1 | 7/1999 |
| EP | 1767580 | A1 | 3/2007 |
| EP | 2032653 | B1 | 12/2009 |
| JP | 06-287308 | * | 10/1994 |
| JP | H07233260 | A | 9/1995 |
| JP | H10140009 | A | 5/1998 |
| JP | H1180362 | A | 3/1999 |
| JP | 200784766 | A | 4/2007 |
| KR | 1020100030959 | A | 3/2010 |
| WO | 2006055231 | A1 | 5/2005 |
| WO | 2006013066 | A2 | 2/2006 |
| WO | 2007148812 | A1 | 12/2007 |
| WO | 2008023537 | A1 | 2/2008 |
| WO | 2009131023 | A1 | 10/2009 |

OTHER PUBLICATIONS

JP 06 287308 machine translation (1994).*
Feng et al. "Organosilicon Polymer and Application Thereof" p. 400-401 Chemical Industry Press (Date unknown).*
Feng et al. "Organosilicon Polymer and Application Thereof" p. 400-401 Chemical Industry Press (Translation)(Date unknown).*

* cited by examiner

*Primary Examiner* — Kuo-Liang Peng
(74) *Attorney, Agent, or Firm* — James E. Piotrowski

(57) ABSTRACT

The present invention provides a polycarbosilane represented by the following formula (1):

$$[R^1R^2R^3SiX_{1/2}]_M[R^4R^5SiX_{2/2}]_D[R^6SiX_{3/2}]_T[SiX_{4/2}]_Q \quad (1); \text{ and}$$

a curable composition comprising:

(A) said polycarbosilane of formula 1 as polycarbosilane A, (B) at least one polycarbosilane B represented by the following formula (2):

$$[R^7R^8R^9SiX_{1/2}]_{M'}[R^{10}R^{11}SiX_{2/2}]_{D'}[R^{12}SiX_{3/2}]_{T'}[SiX_{4/2}]_{Q'}, \quad (2), \text{ and}$$

(C) at least a catalyst.

12 Claims, No Drawings

POLYCARBOSILANE AND CURABLE COMPOSITIONS FOR LED ENCAPSULANTS COMPRISING SAME

FIELD OF THE INVENTION

The present invention relates to a novel silicon-containing polymer, curable compositions comprising such polymer and light emitting devices encapsulated with products prepared by curing these compositions. More particularly, the invention relates to polycarbosilanes and hydrosilylation-curable compositions that cure to form polycarbosilane products having optical clarity, resistance to high temperature, and very good moisture and gas barrier properties. This invention further relates to reliable light emitting devices encapsulated with these polycarbosilane compositions.

BACKGROUND ART

Light emitting diodes (LEDs) have a variety of favorable properties including long life, high brightness, low voltage, small size, an almost complete absence of heat rays during use and good retention of light emitting efficiency even at low temperature.

In a light emitting device such as a light emitting diode (LED), a composition for sealing a light emitting element is required not only to protect the light emitting element from external influences but also to provide satisfactory and stable adhesiveness of the light emitting element to a support substrate of polyphthalamide, ceramics, or the like supporting the light emitting element. The composition needs also to have high transparency so as not to decrease luminance of the light emitting element.

As such a sealing composition, for example, epoxy resin and the like have been conventionally used. However, recently LEDs have become more and more efficient resulting in increased luminance, increased heat generation during use and emission of light of shorter wavelength, and thus the use of the epoxy resin has been a cause of cracking and yellowing.

Therefore, organopolysiloxane compositions (silicone compositions) have been used because of their excellence in heat resistance and ultraviolet resistance. In particular, addition-reaction type silicone compositions curing via hydrosilylation reaction have been widely used since they are excellent in productivity because of their quick curability by heating and avoidance of formation of any byproduct when cured.

Many references deal with such silicone compositions and their use for LED manufacturing.

WO 2008023537 A1 describes a curable organopolysiloxane composition comprising at least the following components: (A) a linear diorganopolysiloxane with a mass average molecular weight of at least 3,000, (B) a branched organopolysiloxane, (C) an organopolysiloxane having, on average, at least two silicon-bonded aryl groups and, on average, at least two silicon-bonded hydrogen atoms in one molecule, and (D) a hydrosilylation reaction catalyst; this composition has excellent curability and, when cured, forms a flexible cured product of high refractive index, optical transmissivity, excellent adherence to various substrates, high hardness and slight surface tack.

EP 2032653 B1 describes a curable organopolysiloxane composition comprising at least the following components: an organopolysiloxane (A) represented by the following general formula: $R^1{}_3SiO(R^1{}_2SiO)_mSiR^1{}_3$ (where $R^1$ is a monovalent hydrocarbon group, and "m" is an integer from 0 to 100); an organopolysiloxane (B) represented by the following average unit formula: $(R^2SiO_{3/2})_a(R^2{}_2SiO_{2/2})_b(R^2{}_3SiO_{1/2})_c$ (where $R^2$ is a monovalent hydrocarbon group, and "a", "b", and "c" are specific numbers); an organopolysiloxane (C) having in one molecule on average at least two silicon-bonded aryl groups and on average at least two silicon-bonded hydrogen atoms; and a hydrosilylation-reaction catalyst (D); this composition is characterized by good fillability and curability and, upon curing, forms a cured body that possesses a high refractive index, high light transmissivity, and strong adhesion to various substrates.

US 20070249790 A1 describes a colorless transparent silicone lens produced by thermally curing a silicone resin composition comprising (A) an organopolysiloxane having a resin structure comprising $R^1SiO_{1.5}$ units, $R^2{}_2SiO$ units, and $R^3{}_aR^4{}_bSiO_{(4-a-b)/2}$ units, wherein $R^1$, $R^2$, and $R^3$ are independently a methyl group, an ethyl group, a propyl group, a cyclohexyl group, or a phenyl group, $R^4$ is a vinyl group or an allyl group, a is 0, 1, or 2, b is 1 or 2, and a+b is 2 or 3, and wherein the number of repetition of the $R^2{}_2SiO$ unit is 5 to 300, (B) an organohydrogen polysiloxane having a resin structure comprising $R^1SiO_{1.5}$ units, $R^2{}_2SiO$ units, and $R^3{}_cH_dSiO_{(4-c-d)/2}$ units, wherein c is 0, 1, or 2, d is 1 or 2, and c+d is 2 or 3, and wherein the number of repetition of the $R^2{}_2SiO$ unit is 5 to 300, and (C) a platinum group catalyst. This composition shows excellent flexibility, transparency, and moldability as well as reduced surface tackiness is provided.

US 20080160322 A1 describes a silicone composition for sealing a light emitting element including (A) a vinyl group-containing organopolysiloxane having a three-dimensional network structure represented by the average unit formula $(SiO_{4/2})_a(ViR_2SiO_{1/2})_b(R_3SiO_{1/2})_c$, wherein Vi represents a vinyl group, R's are identical or different substituted or unsubstituted monovalent hydrocarbon groups other than alkenyl groups, and a, b, and c are positive numbers satisfying that a/(a+b+c) is 0.2 to 0.6 and b/(a+b+c) is 0.001 to 0.2; (B) an organohydrogenpolysiloxane containing at least two hydrogen atoms per molecule, each hydrogen atom being bonded to a silicon atom, the organohydrogenpolysiloxane being contained in such an amount that the amount of hydrogen atoms bonded to a silicon atom is 0.3 to 3.0 mol per 1 mol of a vinyl group bonded to a silicon atom in the component (A); and (C) a catalytic amount of a hydrosilylation catalyst, wherein the coefficient of linear expansion of the composition after curing is $10 \times 10^{-6}$ to $290 \times 10^{-6}/^\circ$ C. It is possible to obtain a cured product whose residual stress with a support substrate is reduced and which has long-term satisfactory and stable adhesiveness.

EP 1767580 A1 discloses an addition reaction curing silicone composition, comprising an organopolysiloxane, wherein some of the silicon atoms may be linked via bivalent hydrocarbon groups of 2 to 10 carbon atoms. However, at least 80 mol-% of all groups bridging two silicon atoms have to be oxygen atoms, i.e. the polymeric backbone predominantly consists of siloxane units with only few silalkylene or silarylene units being allowed. The composition is said to be particularly useful as a sealing material for photo devices such as LEDs, as well as lens material or hard coating agent or the like.

KR 20100030959 A teaches polysiloxanes for sealing materials or a lens of a LED. The polysiloxanes comprise a repeating unit [—Si(R1)(R2)-X1-$C_6H_4$—Y1-]$_m$, wherein R1 and R2 are independently H, methyl, ethyl, phenyl or C2-C6 alkenyl; X1 and Y1 are independently C0-C6 alkylene, C2-C6 alkenylene, C2-C6 alkynylene, NH or O; and m is 1 or more. The presence of siloxane units is not excluded.

From WO 2009/131023 A1 silicon-containing polymers are known comprising -R2-$C_6H_4$-R2- units bridging neighboring silicon atoms, wherein R2 designates identical or different, substituted or unsubstituted alkylene groups. The silicon-containing polymers further comprise siloxane units. The molar amount of units comprising said -R2-$C_6H_4$-R2- bridges within the silicon-containing polymer is below 10%. The polymers may be used in curable polymer compositions suitable for obtaining a cured product characterized by a high index of refraction. Such compositions are useful as a sealant for optical devices such as LEDs and for use in optical instruments.

From the above documents, it can be seen that silicone compositions are widely used as LED encapsulant material. However, since silicone compositions have large free volume as an inherent property, they show much worse gas and moisture barrier properties than epoxy based materials. Thus, moisture penetrates more easily into the encapsulants resulting in the corrosion of LED chips, which greatly influences the durability of LEDs.

Therefore, it is a great challenge to develop an LED encapsulant with both very good gas and moisture barrier properties and at the same time thermal stability equal to the stability of silicone compositions.

SUMMARY OF THE INVENTION

The object of the invention is to provide a composition, which is curable via hydrosilylation and after curing exhibits high transparency, heat stability, and very good gas and moisture barrier properties. Another object is to provide a polymer useful for such a composition. The inventors found that Si-[bivalent hydrocarbon group]-Si bonds, and in particular Si—$C_2H_4$—Si bonds and Si—$C_6H_4$—Si bonds are very stable even at high temperature, and hence, such bonds are used to build up the backbones of polymers according to this invention. Such novel polymers comprise in the backbone solely silicon atoms which are linked via said bivalent hydrocarbon groups and, hence, such polymers are called in the following polycarbosilanes. The objects of the invention are achieved by providing a polymer and composition as set forth hereinafter.

In a first aspect the invention relates to a polycarbosilane represented by the following formula (1):

(1), wherein $R^1$, $R^2$, $R^3$, $R^4$, $R^5$, and $R^6$, each independently designates a methyl group, an ethyl group, a vinyl group, or a phenyl group, with the proviso that each molecule comprises at least 2 vinyl groups; each X independently designates a bivalent $C_2H_4$ hydrocarbon group or phenylene; and M, D, T, and Q each represents a number ranging from 0 to less than 1, provided that M+D+T+Q is 1.

The present invention furthermore provides a curable composition, in particular a transparent LED encapsulant composition, comprising:
(A) at least one polycarbosilane represented by formula (1) given above as polycarbosilane A,
(B) at least one polycarbosilane B represented by the following formula (2):

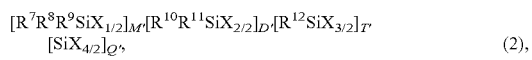
(2), wherein $R^7$, $R^8$, $R^9$, $R^{10}$, $R^{11}$, and $R^{12}$, each independently designates a methyl group, an ethyl group, a vinyl group, a phenyl group, or hydrogen, with the proviso that each molecule comprises at least 2 hydrogen atoms directly bonded to silicon; each X independently designates a bivalent $C_2H_4$ hydrocarbon group or phenylene; and M', D', T', and Q' each represents a number ranging from 0 to less than 1, provided that M'+D'+T'+Q' is 1, and
(C) at least a catalyst.

Furthermore, the present invention relates to a cured polycarbosilane composition obtainable by heating a polycarbosilane composition according to the present invention, as well as to the use of a polycarbosilane composition according to the present invention as semiconductor encapsulating material and/or electronic elements packaging material.

DETAILED DESCRIPTION

The polycarbosilane according to the invention, hereinafter also called polycarbosilane A, is represented by formula (1), polycarbosilane (B) by formula (2). In both cases the polymer comprises different "units", wherein a unit is understood to be a structural motive which is formed of 1 silicon-atom and—according to the number of valencies at the silicon-atom—4 bridging groups X and remaining groups R, respectively, being directly bonded to the silicon-atom. A unit having only one bridging group X may also be called mono-functional or M-unit. A unit having two bridging groups may be called di-functional or D-unit, a unit having three bridging groups tri-functional or T-unit, and a unit having four bridging groups tetra-functional or Q-unit. The number of specific units being present in a particular polymer is represented by the indices M and M', D and D', T and T', and Q and Q'.

It is understood that the bridging units X can be different not only within the various types of units of a particular polycarbosilane but also within various units of one and the same type and even within one single unit. Thus, e.g. a D-unit comprising two bridging groups, like the [$R^4R^5SiX_{2/2}$] unit in formula (1), may contain two identical bridging groups, namely 2/2 bivalent $C_2H_4$ groups or 2/2 phenylene groups. However, such unit may also comprise 1/2 bivalent $C_2H_4$ group and 1/2 phenylene group. The corresponding applies to the bridging groups in T-, and Q-units.

The polycarbosilane A substantially is a liquid or solid polycarbosilane with linear or branched structure represented by the average compositional formula (1) as set forth above.

Preferably, the polycarbosilane A has a branched structure, i.e. corresponds to formula (1), wherein T+Q is greater than 0.

It is preferred that the weight average molecular weight of the polycarbosilane according to the present invention is 100-300,000 g/mol, preferably 1,000-50,000 g/mol (GPC, standard: polystyrene). Their viscosity is preferably 0.1-100 Pa·s at 25° C. and more preferably 0.5-50 Pa·s at 25° C. (Brookfield DV-+Digital Viscometer/LV, (spindle S64, rotation speed 50 rpm)).

In the polycarbosilane according to the invention X preferably designates a bivalent $C_2H_4$ hydrocarbon group.

The curable composition of the invention comprises as polycarbosilane A the polycarbosilane according to the invention as described above. Preferred and particularly preferred polycarbosilanes A correspond to those polycarbosilanes already mentioned above as being preferred and particularly preferred.

A "curable composition" is understood to be a mixture of two or more substances which mixture can be converted from a soft state into a harder state by means of physical or chemical actions. Those physical or chemical actions can consist, for example, in the delivery of energy in the form of heat, light, or other electromagnetic radiation, but also in simply bringing into contact with atmospheric moisture, water, or a reactive component. Preferably, the composition of the present invention is heat-curable.

The curable composition of the invention further comprises at least a polycarbosilane B represented by formula (2). Polycarbosilane B comprises at least two hydrogen atoms directly bonded to silicon per molecule.

Polycarbosilane B substantially is a liquid or solid polycarbosilane with linear or branched structure. Preferably, it has a branched structure, i.e. corresponds to formula (2), wherein T+Q is greater than 0.

It is preferred that the weight average molecular weight of the polycarbosilane B (hydride polycarbosilane or hydrogen polycarbosilane) is 100-300,000 g/mol, and more preferred 1,000-50,000 g/mol (GPC, standard: polystyrene). Their viscosity is preferably 0.1-100 Pa·s at 25° C. and more preferably 0.5-50 Pa·s at 25° C. (Brookfield DV-+Digital Viscometer/LV, (spindle S64, rotation speed 50 rpm)).

The curable composition preferably comprises a polycarbosilane B represented by formula (2), wherein X designates a bivalent $C_2H_4$ hydrocarbon group.

The curable composition preferably comprises polycarbosilane A and poylcarbosilane B in such amounts to provide a molar ratio of silicon-bonded hydrogen atoms (i.e. SiH groups) resulting from the presence of any poylcarbosilane B to silicon-bonded vinyl groups resulting from the presence of any poylcarbosilane A in the range of 0.5 to 10, more preferably of 0.8 to 4, and most preferably of 1 to 3. In other words the Si—H/Si-Vinyl ratio is preferably 0.5-10, more preferably 0.8-4.0, and most preferably 1.0-3.0.

The curable composition furthermore comprises at least a catalyst. As catalyst any compound may be used which is able to promote the hydrosilylation addition reaction between vinyl and/or allyl groups in component (A) and Si—H groups in component (B). Typical addition reaction catalysts are platinum group metal catalysts including platinum catalysts, such as the reaction products of chloroplatinic acid with monohydric alcohols, complexes of chloroplatinic acid with olefins, and platinum bisacetoacetate, as well as palladium catalysts and rhodium catalysts.

Preferably, the catalyst is one or more compound selected from the group consisting of platinum group metal catalysts.

There are no special restrictions with regard to the amount of the catalyst used, provided that it is added in a catalytic amount sufficient for accelerating the desired hydrosilylation reaction. The addition reaction catalyst preferably is used in such an amount to give about 1 to 500 ppm, especially about 2 to 100 ppm of metal, especially of platinum group metal, based on the total weight of the curable composition. The term "metal" or "platinum group metal", respectively, only refers to the content of the metal itself, even if in the curable composition the metal is present as a complex compound.

The curable composition of the invention may be prepared by simply mixing all ingredients. A thus prepared mixture is ready to be applied and to be cured, e.g. by applying heat.

However, in one embodiment of the invention the composition is a two-component preparation consisting of component 1 and component 2, wherein component 1 comprises polycarbosilane A and the total amount of catalyst being present and component 2 comprises the total amount of polycarbosilane B being present and optionally further polycarbosilane A. Each component may be filled in a different container, e.g. a tube or jar, or a different compartment of a two-compartment container, e.g. a two-chamber tube. This allows to safely storing the composition without causing premature curing. Component 1 and component 2 are kept separately until application. To apply the composition, component 1 and component 2 are mixed and the mixture is applied to the desired place.

In addition to the components (A) to (C) described above, the composition according to the present invention may further comprise optional components insofar as the objects of the invention are not compromised.

Possible optional components include addition reaction inhibitors for adjusting curing time and imparting a pot life, and adhesion promoters to improve the adhesive properties of the composition.

Suitable reaction inhibitors include ethynylcyclohexanol, 2-methyl-3-butyn-2-ol, 3,5-dimethyl-1-hexyn-3-ol, 2-phenyl-3-butyn-2-ol, or similar alkyne alcohols; 3-methyl-3-penten-1-yne, 3,5-dimethyl-3-hexen-1-yne, or a similar enyne compound; 1,3,5,7-tetramethyl-1,3,5,7-tetravinyl-cyclotetrasiloxane, 1,3,5,7-tetramethyl-1,3,5,7-tetrahexenyl-cyclotetrasiloxane, benzotriazole, or the like. There are no special restrictions with regard to the quantities in which these inhibitors can be added but it may be recommended that in terms of weight units these inhibitors be added in a quantity of 10 to 1,000 ppm per weight of the composition.

An adhesion promoter is understood to mean a substance that improves the adhesion properties of the composition on surfaces. Conventional adhesion promoters (tackifiers) known to the person skilled in the art can be used individually or as a combination of several compounds. Suitable examples include resins, terpene oligomers, coumarone/indene resins, aliphatic petrochemical resins and modified phenolic resins. Suitable within the framework of the present invention are, for example, hydrocarbon resins, as obtained by polymerization of terpenes, mainly α- or β-pinene, dipentene or limonene. Polymerization of these monomers is usually cationic with initiation using Friedel-Crafts catalysts. The terpene resins also include copolymers of terpenes and other monomers, such as styrene, α-methylstyrene, isoprene and the like. The above-mentioned resins are used, for example, as adhesion promoters for pressure-sensitive adhesives and coating materials. Also suitable are the terpene phenolic resins, which are produced by acid-catalyzed addition of phenols to terpenes or rosin. Terpene phenolic resins are soluble in most organic solvents and oils and miscible with other resins, waxes and rubber. Also suitable as adhesion promoters within the framework of the present invention in the above sense are the rosins and their derivatives, such as esters or alcohols thereof. Particularly suitable are silane adhesion promoters, in particular aminosilanes and epoxysilanes, for example 3,4-epoxycyclohexylethyl trimethoxysilane.

In a specific embodiment of the curable composition according to the invention, the composition comprises an aminosilane of the general formula (3)

R'R''N—R—SiX'Y'Z'     (3)

as an adhesion promoter, in which
R' and R'' are, independently of one another, hydrogen or $C_1$-$C_8$ alkyl residues,
R is a divalent hydrocarbon residue having 1-12 C atoms optionally containing a heteroatom, and
X', Y', Z' are, independently of one another, $C_1$-$C_8$ alkyl, $C_1$-$C_8$ alkoxy or $C_1$-$C_8$ acyloxy residues, at least one of the residues being a $C_1$-$C_8$ alkoxy or $C_1$-$C_8$ acyloxy group. Such compounds inherently exhibit a high affinity to the binding polymer components of the curable composition according to the invention, but also to a wide range of polar and non-polar surfaces and therefore contribute to the formation of particularly stable adhesion between the cured composition and the substrates to be bonded or encapsulated in each case.

The linking group R can be, for example, a straight-chained or branched or cyclic, substituted or unsubstituted alkylene residue. As a heteroatom, nitrogen (N) or oxygen (O) is optionally contained therein. If X', Y' and/or Z' are an acyloxy group, this can be, for example, the acetoxy group —OCO—$CH_3$.

Insofar as transparency is not impaired, there may be blended inorganic fillers for enhancing the strength of the composition.

Suitable fillers for the composition according to the invention are, for example, chalk, lime powder, precipitated and/or pyrogenic silica, zeolites, bentonites, magnesium carbonate, kieselguhr, alumina, clay, talc, titanium oxide, iron oxide, zinc oxide, sand, quartz, flint, mica, glass powder and other ground minerals. In addition, organic fillers, especially carbon black, graphite, wood fibers, wood flour, sawdust, wood pulp, cotton, pulp, wood chips, chopped straw, chaff, ground walnut shells and other chopped fibers, can also be used. Furthermore, short fibers such as glass fiber, glass filament, polyacrylonitrile, carbon fiber, Kevlar fiber or polyethylene fibers can also be added. Aluminum powder is also suitable as filler. In addition, hollow spheres with a mineral shell or a plastic shell are suitable as fillers. These can be, for example, hollow glass spheres, which are commercially available with the trade names Glass Bubbles®. Hollow spheres based on plastics are available for example under the trade names Expancel® or Dualite®. These are composed of inorganic or organic substances, each having a diameter of 1 mm or less, preferably of 500 μm or less. For some applications, fillers which impart thixotropy to the preparations are preferred. Such fillers are also described as rheological auxiliaries, e.g. hydrogenated castor oil, fatty acid amides or swellable plastics such as PVC. So that they can be pressed out readily from a suitable metering device (e.g. tube), such preparations have a viscosity of 3,000 to 15,000, preferably 4,000 to 8,000 mPas or 5,000 to 6,000 mPas.

The fillers may be used in a quantity of 1 to 80 wt. %, based on the total weight of the composition. A single filler or a combination of several fillers can be used.

In a preferred embodiment of the composition according to the invention, the filler is highly dispersed silica having a BET surface area of 10 to 90 $m^2/g$, in particular from 35 to 65 $m^2/g$. When silica of this type is used, it does not cause a substantial increase in the viscosity of the composition according to the invention but contributes to a reinforcement of the cured composition. By means of this reinforcement, for example, the initial strengths, shear strengths and the adhesion of the adhesives, sealants or coating compositions in which the composition according to the invention is used are improved.

Particularly preferably, highly dispersed silica having a BET surface area of 45 to 55 $m^2/g$, in particular having a BET surface area of about 50 $m^2/g$, is used. Such silicas have the added advantage of a 30 to 50% shorter incorporation time in comparison to silicas with a higher BET surface area. Another advantage lies in the fact that said highly dispersed silica can be incorporated at a considerably higher concentration without the transparency and the flow properties of the compositions being impaired. Particular preference is also given to an embodiment of the composition according to the invention in which the filler is highly dispersed silica with a mean particle size $d_{50}$, measured by laser diffraction, of less than 25 μm, preferably from 5 to 20 μm. A filler of this type is especially suitable where highly transparent, clear compositions are needed for particularly demanding applications. It is also conceivable to use pyrogenic and/or precipitated silicas with a relatively high BET surface area, advantageously with 100-250 $m^2/g$, in particular 110-170 $m^2/g$, as filler. The incorporation of such silicas, however, takes a comparatively long time and is therefore more costly. In addition, significant quantities of air are introduced into the product, which has to be removed again in a complicated and time-consuming manner. On the other hand, the effect of a reinforcement of the cured composition due to the higher BET surface area can be achieved with a smaller proportion by weight of silica. In this way, additional substances can be introduced to improve the preparation according to the invention with regard to other requirements.

In the event that a basic filler is to be used instead of acidic fillers, for example calcium carbonates (chalks) are suitable, in which case cubic, non-cubic, amorphous and other modifications can be used. Preferably, the chalks used are surface treated or coated. As a coating agent, preferably fatty acids, fatty acid soaps and fatty acid esters are used, for example lauric acid, palmitic acid or stearic acid, sodium or potassium salts of such acids or their alkyl esters. In addition, however, other surface-active substances, such as sulfate esters of long-chain alcohols or alkylbenzenesulfonic acids or their sodium or potassium salts or coupling reagents based on silanes or titanates, are also suitable. The surface treatment of chalks is often associated with an improvement in processability and adhesive strength and also the weathering resistance of the compositions. The coating composition is usually used in a proportion of 0.1 to 20 wt %, preferably 1 to 5 wt %, based on the total weight of the crude chalk.

Depending on the desired property profile, precipitated or ground chalks can be used. Ground chalks can be produced, for example, from natural lime, limestone or marble by mechanical grinding, using either dry or wet methods. Depending on the grinding process, fractions having different average particle sizes can be obtained. Advantageous specific surface area values (BET) are between 1.5 $m^2/g$ and 50 $m^2/g$.

If desired, phosphor and antidegradants may also be added.

Further auxiliary substances and additives include plasticizers, stabilizers, antioxidants, reactive diluents, drying agents, UV stabilizers, anti-ageing agents, rheological auxiliaries, fungicides and/or flame retardants.

Curing of the compositions according to the invention typically involves heating at 50 to 200° C., and particularly at 70 to 160° C., for 1 to 60 minutes, and particularly for 2 to 30 minutes. Furthermore, post-curing may also be conducted at 50 to 200° C., and particularly at 70 to 160° C., for 0.1 to 10 hours, and particularly for 1 to 4 hours.

Furthermore, the invention relates to cured products obtainable by heating a curable composition according to the invention.

A further subject matter of the present invention is the use of a curable polycarbosilane composition according to the invention in encapsulation, sealing, protection, bonding and/or lens formation materials, in particular as semiconductor encapsulating material and/or electronic elements packaging material. The polycarbosilane composition of the invention can provide enhanced barrier properties against moisture and gases. In particular, the polycarbosilane composition according to the invention is advantageously used in encapsulation materials for the encapsulation of semiconductor devices, especially of light emitting devices (LEDs).

EXAMPLES

As follows is a description of particular aspects of the present invention using a series of examples, however, the present invention is in no way restricted to the below presented examples.

Test Methods:
The evaluations were conducted in the manner described below.
In the following examples, weight average molecular weight values are polystyrene-equivalent values measured using gel permeation chromatography (GPC).
Vinyl content was titrated according to Chinese Chemical Industry Standard HG/T 3312-2000. Hydrogen content was titrated as disclosed in Feng S.Y.; Zhang, J.; Li, M. J.; Zhu, Q. Z.; Organosilicon Polymer and Application Thereof, p. 400-401; Chemical Industry Press. Hardness was measured with a LX-A Shore durometer.
Transmittance was measured by an UV-Visible spectrum analyzer Lambda 650S manufactured by PerkinElmer Corporation. The transmittance was measured for the range from 300 nm to 800 nm, and the value at 450 nm was recorded as the transmittance.
Permeation was measured by Mocon Permatran-W® model 3/33 at 50° C./100% RH (RH=relative humidity).

Raw Materials:
Divinyldimethylsilane (CAS 10519-87-6) was purchased from Ruilijie Chemical Company. Diphenylsilane (CAS: 775-12-2), bis(dimethylsilyl)benzene (CAS: 2488-01-9) and trivinylmethylsilane (CAS: 18244-95-6) was purchased from Gelest. Platinum catalyst SIP 6832.2 (2.0-2.3% platinum concentration in cyclic methylvinylsiloxanes, CAS: 68585-32-0) was purchased from Gelest. Besides, platinum oxide (CAS: 1314-15-4) was purchased from J&K. Platinum catalyst VM-23 (platinum in divinyltetramethyldisiloxane) was purchased from ZheJiang Jiancheng Silicone Co. Ltd.

Synthesis Example 1

Vinylpolycarbosilane (VPCS), n=5, Linear 57.79 g diphenylsilane, 42.21 g divinyldimethylsilane and 0.0183 g platinum catalyst SIP 6832.2 were added into a 100 mL steel vial. After purging with nitrogen gas, the reaction system was put into an oven at 175° C. for 48 h. The unreacted monomer was removed by rotary evaporation at 110° C. and 5 mbar for 1 h. The obtained liquid had a weight average molecule weight of 1592, and its vinyl content was 1.25 mmol/g. The obtained polymer has an average formula of $$[Vi(CH_3)_2Si(C_2H_4)_{1/2}]_{0.182}[Ph_2Si(C_2H_4)_{2/2}]_{0.454}$$
$$[(CH_3)_2Si(C_2H_4)_{2/2}]_{0.364}$$

Synthesis Example 2

VPCS, n=10, Linear 59.90 g diphenylsilane, 40.10 g divinyldimethylsilane and 0.0183 g platinum catalyst SIP 6832.2 were added into a 100 mL steel vial. After purging with nitrogen gas, the reaction system was put into an oven at 175° C. for 48 h. The unreacted monomer was removed by rotary evaporation at 110° C. and 5 mbar for 1 h. The obtained liquid had a weight average molecule weight of 3072, and its vinyl content was 0.65 mmol/g. The obtained polymer has an average formula of $$[Vi(CH_3)_2Si(C_2H_4)_{1/2}]_{0.095}[Ph_2Si(C_2H_4)_{2/2}]_{0.476}$$
$$[(CH_3)_2Si(C_2H_4)_{2/2}]_{0.429}$$

Synthesis Example 3

VPCS, Branched 60.15 g diphenylsilane, 31.73 g divinyldimethylsilane, 8.12 g trivinylmethylsilane and 0.0183 g platinum catalyst SIP 6832.2 were added into a 100 mL steel vial. After purging with nitrogen gas, the reaction system was put into an oven at 175° C. for 48 h. The unreacted monomer was removed by rotary evaporation at 110° C. and 5 mbar for 1 h. The obtained liquid polymer has a branched structure, a weight average molecule weight of 1690, and its vinyl content was 1.8 mmol/g.

Synthesis Example 4

VPCS, Branched 60.10 g diphenylsilane, 26.41 g divinyldimethylsilane, 13.49 g trivinylmethylsilane and 0.0183 g platinum catalyst SIP 6832.2 were added into a 100 mL steel vial. After purging with nitrogen gas, the reaction system was put into an oven at 175° C. for 48 h. The unreacted monomer was removed by rotary evaporation at 110° C. and 5 mbar for 1 h. The obtained liquid polymer has a branched structure, a weight average molecule weight of 2000, and its vinyl content was 2 mmol/g.

Synthesis Example 5

Hydrogenpolycarbosilane (HPCS), Si3H4, Phenyl Content

Dichlorophenylsilane (25.00 g), divinyldimethylsilane (7.52 g), and 3 drops platinum catalyst VM-23 were added into a flask (100 mL) with a stir bar. The flask was put into an oil bath at 70° C. After stirring for 1 hour, the oil bath was heated to 150° C. and the reaction mixture was stirred for additional 3 hours. Then 50 ml THF was added after the flask was cooled down to room temperature. The solution was transferred to a dropping funnel for hydrogenation.
A three-neck flask was equipped with a condenser and the dropping funnel. LiAlH$_4$ (10.73 g) was charged into the three-neck flask before dry THF (400 ml) was added slowly. The system was protected by nitrogen gas. After the solution in the dropping funnel had been added dropwise within one hour, the flask was put into a oil bath at 70° C. and stirred for 4 hours. The gray solution was added to cold HCl aqueous solution (1 L, 2 mol/L). Afterwards the solution was extracted twice with toluene (200 ml each). The toluene solution was washed with distilled water until neutral, and then toluene was removed by rotary evaporation. A colorless liquid (20 g) was collected. The obtained liquid has an average formula of $$[H_2PhSi(C_2H_4)_{1/2}]_{0.66}[(CH_3)_2Si(C_2H_4)_{2/2}]_{0.34}$$

Synthesis Example 6

HPCS, Si4H3, No Phenyl

Dimethylchlorosilane (38 ml) and 2 drops platinum catalyst VM-23 were charged into a three-neck flask equipped with a condenser, a dropping funnel and a stopper. The flask was heated up to 50° C. before methyltrivinylsilane (12.40 g) was added dropwise. The reaction mixture was held at 60° C. for 20 minutes. A white solid was obtained. 50 ml THF was added to dissolve the solid and the solution was transferred to a dropping funnel for hydrogenation.
A three-neck flask was equipped with a condenser and the dropping funnel. LiAlH$_4$ (12.12 g) was charged into the three-neck flask before dry THF (400 ml) was added slowly. The system was protected by nitrogen gas. After the solution in the dropping funnel had been added dropwise within one hour, the flask was put into an oil bath at 70° C. and stirred for 4 hours. The gray solution was added to cold HCl aqueous solution (1 L, 2 mol/L). Afterwards the solution was extracted twice with toluene (200 ml each). The toluene solution was washed with distilled water until neutral, and then toluene was removed by rotary evaporation. A colorless liquid (26.16 g) was collected. The obtained liquid has an average formula of $[H(CH_3)_2Si(C_2H_4)_{1/2}]_{0.75}[CH_3Si(C_2H_4)_{3/2}]_{0.25}$

Synthesis Example 7

HPCS, Si3H2, No Phenyl

Si3H2 was prepared in the same manner as Si4H3 in Synthetic Example 6 except that methyltrivinylsilane was replaced by the same molar amount of dimethyldivinylsilane. The obtained liquid has an average formula of $[H(CH_3)_2Si(C_2H_4)_{1/2}]_{0.66}[(CH_3)_2Si(C_2H_4)_{2/2}]_{0.34}$

Synthesis Example 8

VPCS, No Phenyl

Trivinylmethylsilane (6.2 g), platinum catalyst VM-23 (2 drops) and THF (10 ml) were charged into a flask; at room temperature Si3H2 from Synthesis Example 7 (8.7 g) was added dropwise at a rate of 20 drops/min. Then the solution was stirred at 50° C. until the SiH signal at 2116 cm$^{-1}$ was no longer visible in IR spectrum. Upon removal of THF by rotary evaporation at 70° C. a colorless liquid was obtained. The obtained liquid polymer has a branched structure, a weight average molecule weight of 83811, and its vinyl content was 2.51 mmol/g.

Synthesis Example 9

HPCS

Into a 100 mL dry and clean round bottom flask (two or three neck) was added 0.008 g PtO$_2$, 1.5 g divinyldimethylsilane, 5.2 g bis(dimethylsilyl)benzene and 2.0 g toluene. A magnetic stirrer was added and the flask was capped with a stopper and a condenser. The reaction mixture was stirred at 75° C. for 3 hour. Subsequently, the solution was filtrated to remove PtO$_2$. After that, the total solution was distilled by rotary evaporation at 90° C. and 20 mbar for 1 h, and then at 90° C. and 5 mbar for another 1 h. The obtained liquid has an average formula of $[H(CH_3)_2Si(C_6H_4)_{1/2}]_{0.40}[(CH_3)_2Si(C_6H_4)_{1/2}(C_2H_4)_{1/2}]_{0.40}[(CH_3)_2Si(C_2H_4)_{2/2}]_{0.20}$

Application Example 1

2.0 g vinylpolycarbosilane of synthesis example 2, 0.3 g hydrogenpolycarbosilane of synthesis example 5, 0.001 g platinum catalyst SIP 6832.2 and 0.001 g 3,5-dimethyl-1hexyn-3-ol were mixed. The resulting mixture was heated at 150° C. for 2 hours to yield a cured product. The product was evaluated regarding Shore A hardness, permeation, initial transparency at 450 nm (T@450 nm (initial)), and transparency at 450 nm after heat treatment of the product at 150° C. for 100 hours (T@450 nm (150° C., 100 hours)). The results are shown in Table 1.

Application Example 2

2.0 g vinylpolycarbosilane of synthesis example 8, 0.8 g hydrogenpolycarbosilane of synthesis example 6, 0.001 g platinum catalyst SIP 6832.2 and 0.001 g 3,5-dimethyl-1hexyn-3-ol were mixed together. The resulting mixture was heated at 150° C. for 2 hours to yield a cured product. The product was evaluated regarding Shore A hardness, permeation, initial transparency at 450 nm, and transparency at 450 nm after heat treatment of the product at 150° C. for 100 hours. The results are shown in Table 1.

Comparative Example 1

The two components A and B of a high RI (refractive index) encapsulating material commercially available from Dow Corning under the name OE6636 (phenyl type) were mixed at a weight ratio of A:B=1:2 and heated at 70° C. for 1 hour, 120° C. for 1 hour and 150° C. for 1 hour. The resulting cured product was evaluated regarding Shore A hardness, permeation, initial transparency at 450 nm, and transparency at 450 nm after heat treatment of the product at 150° C. for 100 hours. The results are shown in Table 1.

Comparative Example 2

The two components A and B of a normal RI encapsulating material commercially available from Shinetsu under the name KER2500 (methyl type) were mixed at a weight ratio of A:B=1:1 and heated at 70° C. for 1 hour, 120° C. for 1 hour and 150° C. for 1 hour. The resulting cured product was evaluated regarding Shore A hardness, permeation, initial transparency at 450 nm, and transparency at 450 nm after heat treatment of the product at 150° C. for 100 hours. The results are shown in Table 1.

TABLE 1

| Item | Application example 1 (Phenyl) | Application example 2 (Methyl) | Comparative example 1 (Phenyl) | Comparative example 2 (Methyl) |
|---|---|---|---|---|
| Hardness (Shore A) | 90 | 87 | 85 | 70 |
| Permeation (50° C. C) (g · mil/100 inch$^2$ · day) | 37 | 78 | 83 | 202 |
| T @ 450 nm (initial) | 87.0% | 91.0% | 90.0% | 92.60% |
| T @ 450 nm (150° C., 100 hours) | 85.0% | 91.0% | 88.80% | 92.20% |

As can be seen from the results given in Table 1 cured products according to the invention show improved hardness and permeation behavior compared to cured products obtainable from commercially available encapsulating materials based on organopolysiloxanes. Thermal stabilities are similar.

What is claimed is:
1. A curable composition, comprising:
(A) at least one polycarbosilane A, represented by the following formula (1):

$[R^1R^2R^3SiX_{1/2}]_M[R^4R^5SiX_{2/2}]_D[R^6SiX_{3/2}]_T[SiX_{4/2}]_Q$ (1), wherein R$^1$, R$^2$, R$^3$, R$^4$, R$^5$, and R$^6$, each independently designates a methyl group, an ethyl group, a vinyl group, or a phenyl group, with the proviso that each molecule comprises at least 2 vinyl groups; each X independently designates a bivalent C$_2$H$_4$ hydrocarbon group or phenylene; and M, D, T, and Q each represents a number ranging from 0 to less than 1, provided that M+D+T+Q is 1, wherein T+Q is greater than 0

(B) at least one polycarbosilane B represented by the following formula (2):

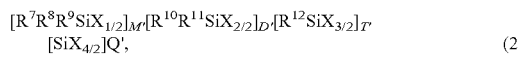 (2), wherein $R^7$, $R^8$, $R^9$, $R^{10}$, $R^{11}$, and $R^{12}$, each independently designates a methyl group, an ethyl group, a vinyl group, a phenyl group, or hydrogen, with the proviso that each molecule comprises at least 2 hydrogen atoms directly bonded to silicon; each X independently designates a bivalent $C_2H_4$ hydrocarbon group or phenylene; and M', D', T', and Q' each represents a number ranging from 0 to less than 1, provided that M'+D'+T'+Q' is 1, and (C) at least a catalyst.

2. The composition according to claim 1, wherein polycarbosilane A and polycarbosilane B is present in respective amounts to provide a molar Si—H/Si-Vinyl ratio of 0.5-10.

3. The composition according to claim 1, wherein the weight average molecular weight of the polycarbosilane B is 100-300,000 g/mol.

4. The composition according to claim 1, wherein the catalyst is one or more selected from the group consisting of platinum group metal catalysts.

5. The composition according to claim 1, wherein the catalyst is present in such an amount that the content of the catalytic metal is in the range of 1 to 500 ppm based on the total weight of the curable composition.

6. The composition according to claim 1, wherein the composition is a two-component preparation consisting of component 1 and component 2, wherein component 1 comprises polycarbosilane A and the total amount of catalyst being present and component 2 comprises the total amount of polycarbosilane B being present and optionally further polycarbosilane A.

7. Cured reaction products of the curable composition according to claim 1.

8. A semiconductor encapsulated within cured reaction products of the composition according to claim 1.

9. The composition according to claim 1, wherein polycarbosilane A and polycarbosilane B is present in respective amounts to provide a molar Si—H/Si-Vinyl ratio of 1.0-3.0.

10. The composition according to claim 1, wherein the weight average molecular weight of the polycarbosilane B is 1,000-50,000 g/mol.

11. The composition according to claim 1, wherein the catalyst is present in such an amount that the content of the catalytic metal is in the range of 2 to 100 ppm, based on the total weight of the curable composition.

12. The polycarbosilane according to claim 4, wherein at least one X is a phenylene.

* * * * *